(12) United States Patent
Nelson et al.

(10) Patent No.: US 9,741,619 B2
(45) Date of Patent: Aug. 22, 2017

(54) METHODS FOR SINGULATING SEMICONDUCTOR WAFER

(71) Applicant: UTAC Headquarters Pte. Ltd., Singapore (SG)

(72) Inventors: William John Nelson, Singapore (SG); Nathapong Suthiwongsunthorn, Singapore (SG); Beng Yeung Ho, Singapore (SG); Poh Leng Wilson Ong, Singapore (SG)

(73) Assignee: UTAC HEADQUARTERS PTE. LTD., Singapore (SG)

( * ) Notice: Subject to any disclaimer, the term of this patent is extended or adjusted under 35 U.S.C. 154(b) by 0 days.

(21) Appl. No.: 15/402,192

(22) Filed: Jan. 9, 2017

(65) Prior Publication Data

US 2017/0117185 A1 Apr. 27, 2017

Related U.S. Application Data

(63) Continuation of application No. 14/881,181, filed on Oct. 13, 2015, now Pat. No. 9,570,314.

(Continued)

(51) Int. Cl.

| H01L 21/00 | (2006.01) |
|---|---|
| *H01L 21/78* | (2006.01) |
| *H01L 21/3065* | (2006.01) |
| *H01L 21/304* | (2006.01) |
| *H01L 21/308* | (2006.01) |
| *H01L 21/311* | (2006.01) |
| *H01L 23/31* | (2006.01) |
| *H01L 23/00* | (2006.01) |
| *H01L 21/268* | (2006.01) |

(Continued)

(52) U.S. Cl.
CPC ............ *H01L 21/78* (2013.01); *H01L 21/268* (2013.01); *H01L 21/304* (2013.01); *H01L 21/3065* (2013.01); *H01L 21/3083* (2013.01); *H01L 21/31133* (2013.01); *H01L 21/31144* (2013.01); *H01L 23/293* (2013.01); *H01L 23/3114* (2013.01); *H01L 23/3171* (2013.01); *H01L 23/544* (2013.01); *H01L 24/14* (2013.01); *H01L 2223/54453* (2013.01)

(58) Field of Classification Search
CPC ............... H01L 21/82; H01L 21/31133; H01L 21/21144; H01L 21/304; H01L 23/3114; H01L 24/14
See application file for complete search history.

(56) References Cited

U.S. PATENT DOCUMENTS 6,465,158 B1 10/2002 Sekiya
6,642,127 B2 11/2003 Kumar et al.
(Continued)

*Primary Examiner* — Alonzo Chambliss
(74) *Attorney, Agent, or Firm* — Horizon IP Pte Ltd.

(57) ABSTRACT

Methods for dicing a wafer is presented. The method includes providing a wafer having first and second major surfaces. The wafer is prepared with a plurality of dies on main device regions and are spaced apart from each other by dicing channels on the first major surface of the wafer. A film is provided over first or second major surface of the wafer. The film covers at least areas corresponding to the main device regions. The method also includes using the film as an etch mask and plasma etching the wafer through exposed semiconductor material of the wafer to form gaps to separate the plurality of dies on the wafer into a plurality of individual dies.

20 Claims, 9 Drawing Sheets

Related U.S. Application Data

(60) Provisional application No. 62/062,967, filed on Oct. 13, 2014.

(51) Int. Cl.
*H01L 23/544* (2006.01)
*H01L 23/29* (2006.01)

(56) References Cited

U.S. PATENT DOCUMENTS

| | | |
|---|---|---|
| 6,686,225 B2 | 2/2004 | Wachtler |
| 6,803,247 B2 | 10/2004 | Sekiya |
| 7,781,310 B2 | 8/2010 | Grivna |
| 7,985,661 B2 | 7/2011 | Grivna |
| 7,989,319 B2 | 8/2011 | Grivna et al. |
| 8,012,857 B2 | 9/2011 | Grivna et al. |
| 8,222,120 B2 | 7/2012 | Chun et al. |
| 9,041,198 B2 | 5/2015 | Lei et al. |
| 9,570,314 B2 * | 2/2017 | Nelson ............... H01L 21/31144 |
| 2015/0303111 A1 | 10/2015 | Lei et al. |
| 2016/0049348 A1 | 2/2016 | Zhao et al. |

* cited by examiner

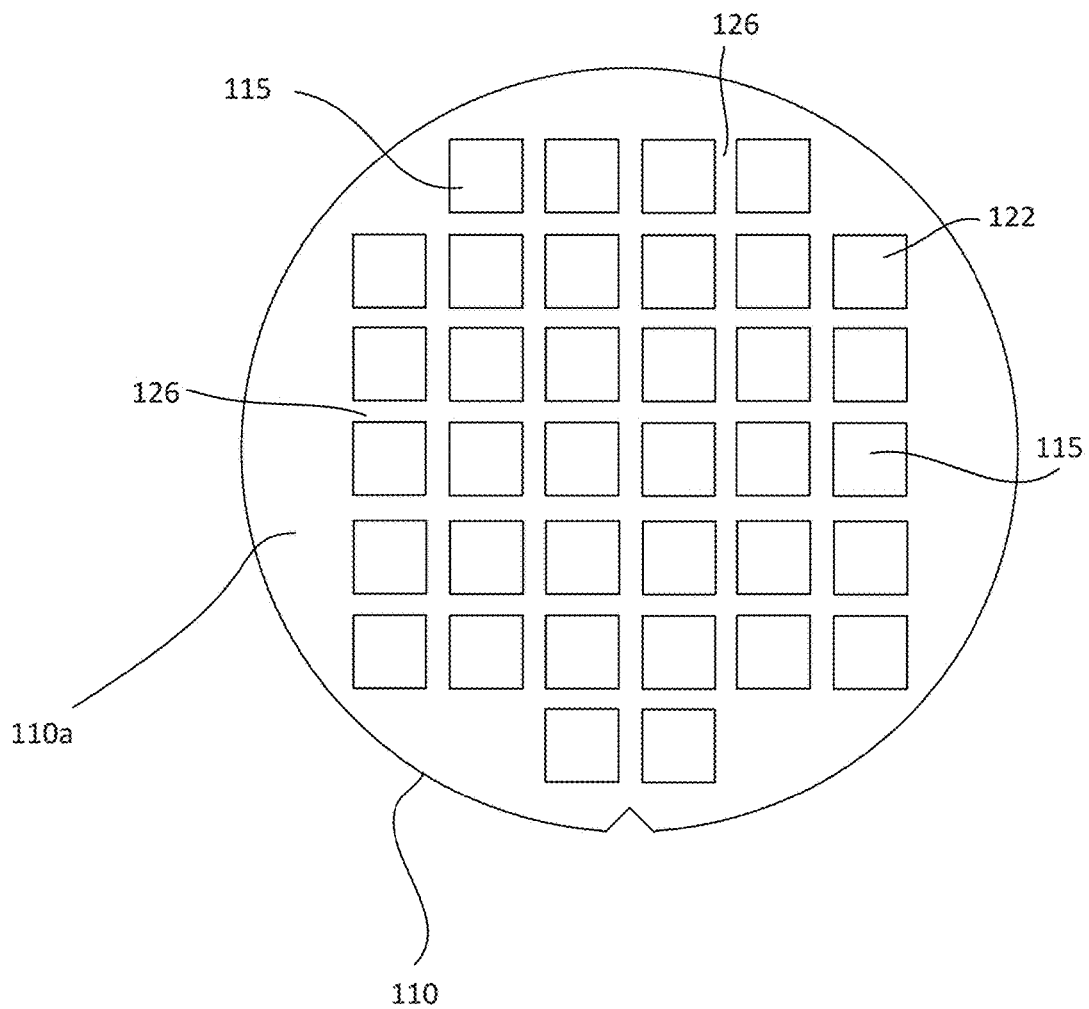
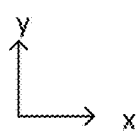
Fig. 1

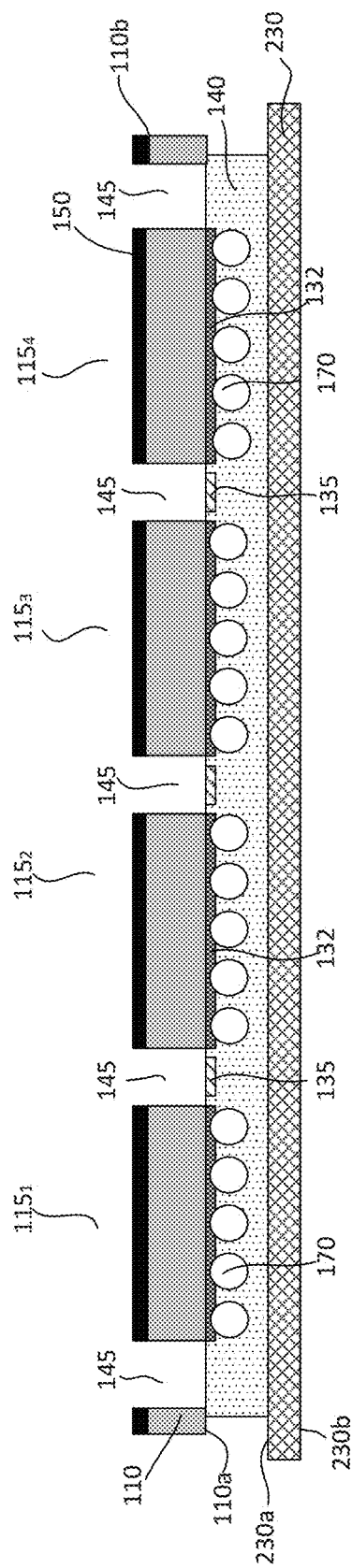

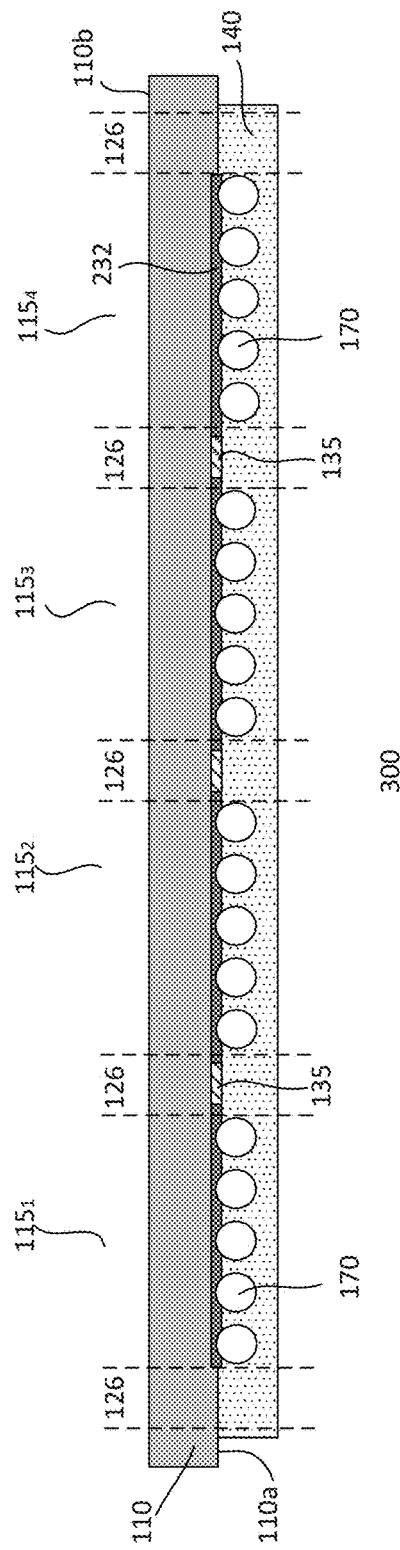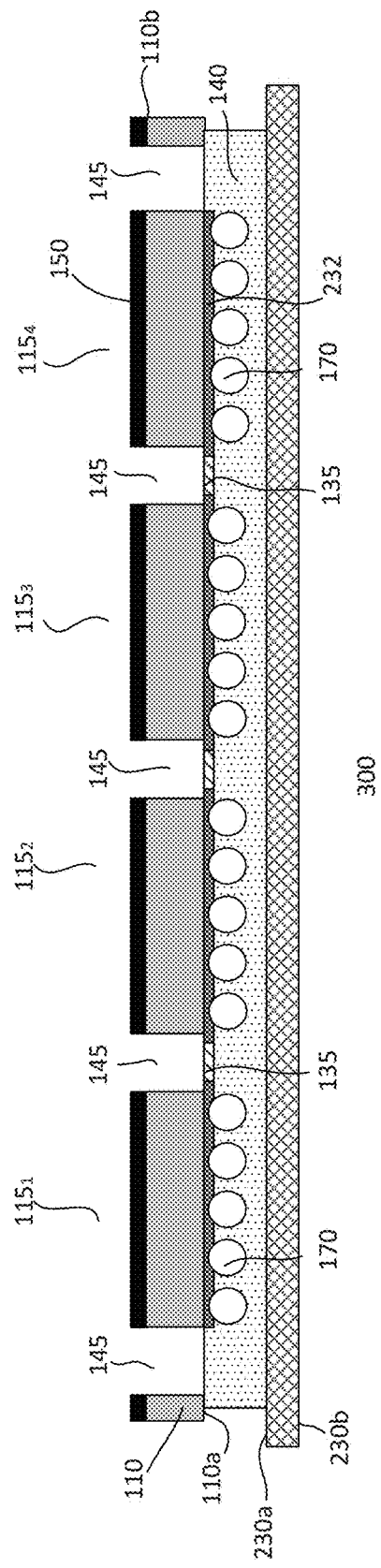

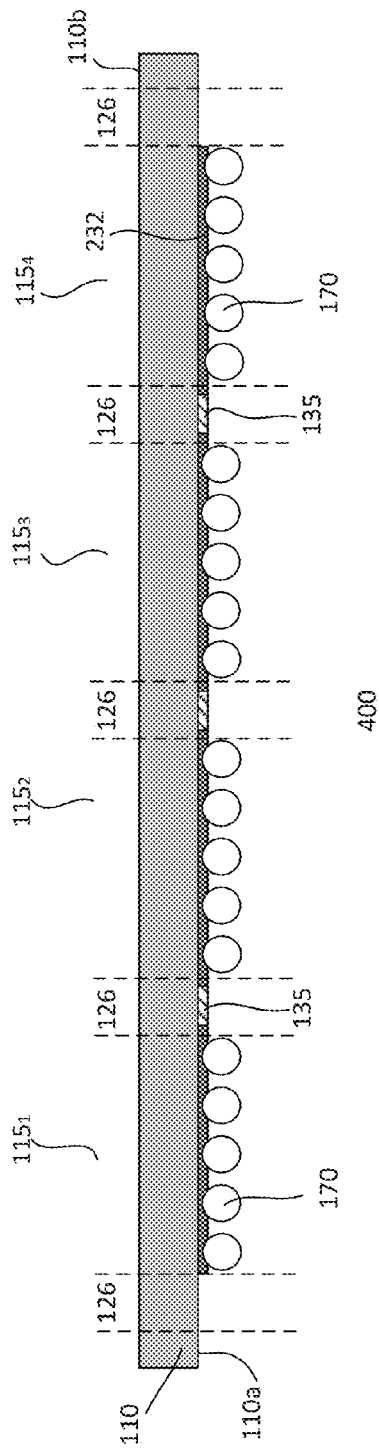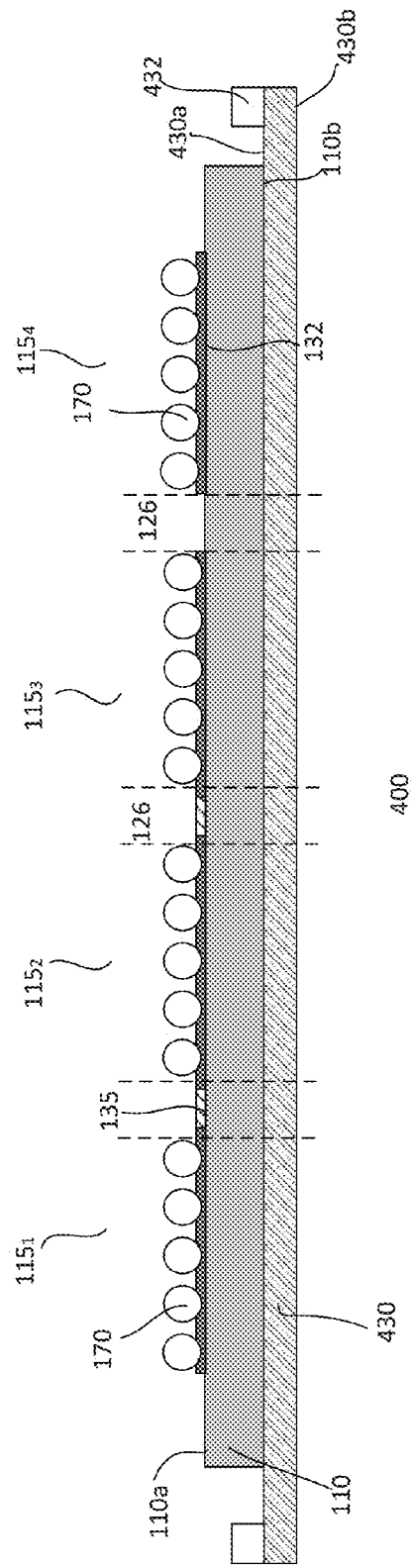
Fig. 4a
Fig. 4b

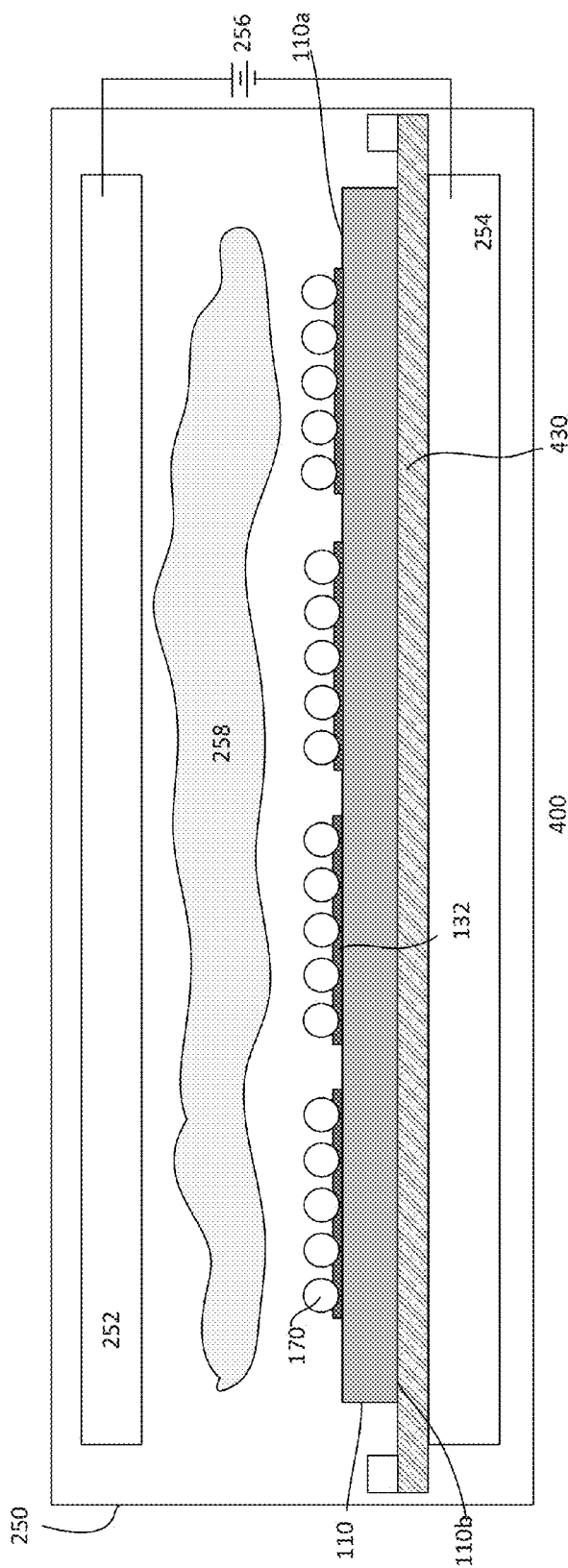
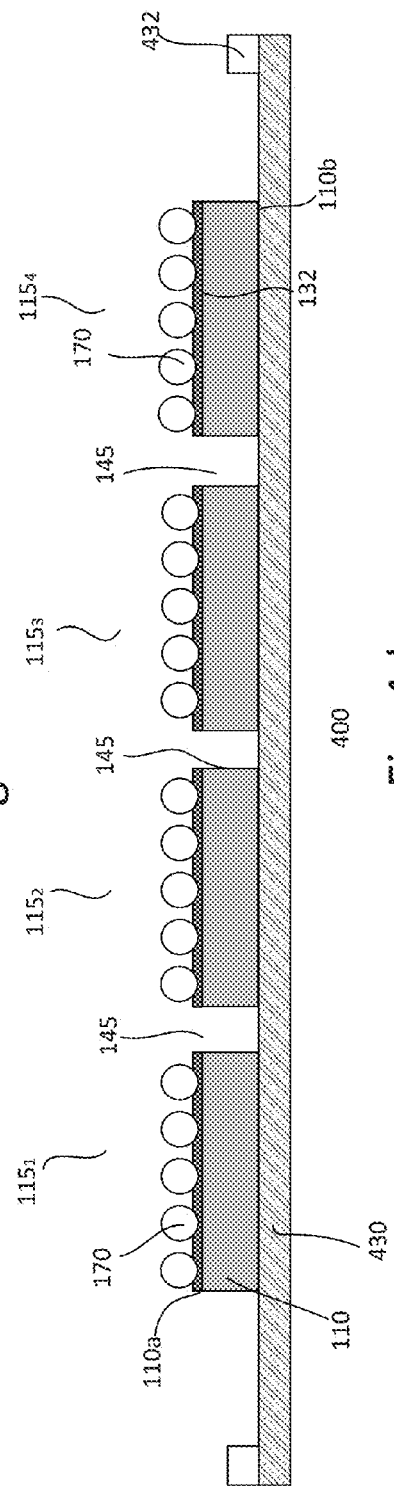
Fig. 4c
Fig. 4d

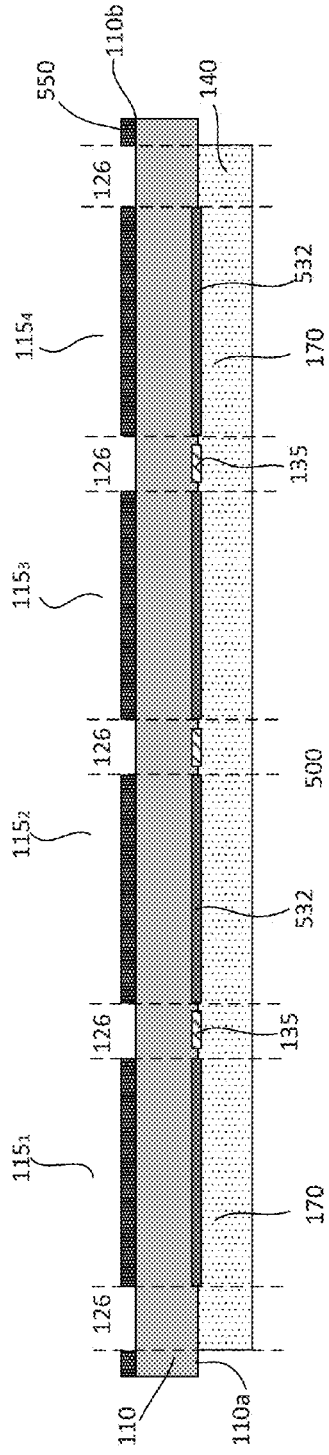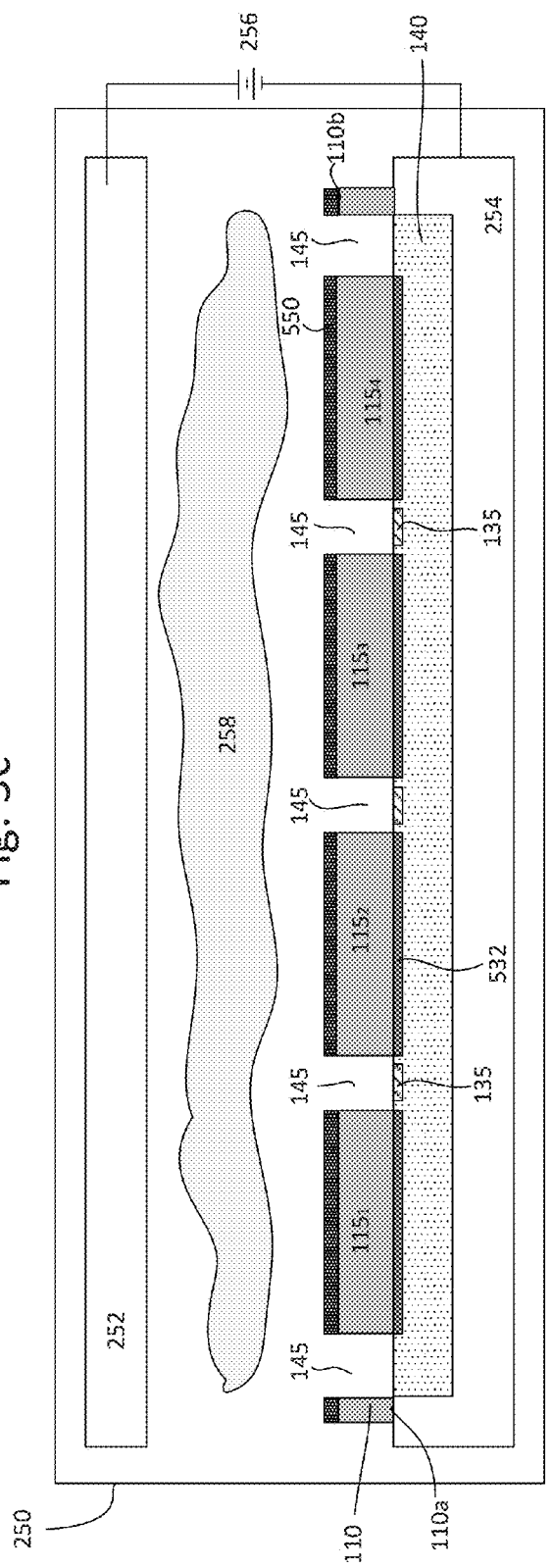

US 9,741,619 B2

METHODS FOR SINGULATING SEMICONDUCTOR WAFER

CROSS-REFERENCE TO RELATED APPLICATION

This application is a continuation application which claims the benefit of co-pending U.S. patent application Ser. No. 14/881,181, filed on Oct. 13, 2015, which claims the benefit of U.S. Provisional Application No. 62/062,967 entitled "Method of Singulating Semiconductor Chips" filed on Oct. 13, 2014. All disclosures are herein incorporated by reference in their entireties for all purposes.

BACKGROUND

Singulation process, also known as dicing, is generally performed to separate a plurality of chips formed on a wafer. Various singulation techniques may be used to separate the plurality of chips formed on the wafer into individual chips for packaging. One of the common techniques used is mechanical sawing. In a mechanical sawing process, a diamond saw rotating at high speed cuts the wafer along saw streets or dicing channels to separate the chips from each other. However, crack or chipping tends to occur in each chip due to mechanical stress caused by the blade. Furthermore, it is very time consuming when mechanical sawing process is used to separate the chips from the entire wafer.

In an effort to mitigate the problems above, a plasma etch process has been proposed to be used in singulating or dicing a wafer. However, we have observed that conventional plasma etch process may not effectively separate the dies from the wafer and the singulated dies may also suffer contamination caused by the plasma etch process. Conventional plasma etch process may also result in rough or uneven lateral surfaces or sidewalls of the singulated die.

In view of the foregoing, there is a desire to provide reliable, simplified, efficient and cost effective methods for singulating semiconductor chips or dies from a wafer.

SUMMARY

Embodiments generally relate to semiconductor dies singulation methods. In one aspect, a method for dicing a wafer is disclosed. The method includes providing a wafer having first and second major surfaces. The wafer is prepared with a plurality of dies on main device regions and are spaced apart from each other by dicing channels on the first major surface of the wafer. A film is provided over first or second major surface of the wafer. The film covers at least areas corresponding to the main device regions. The method also includes using the film as an etch mask and performing a plasma etching process to etch the wafer through exposed semiconductor material of the wafer to form gaps to separate the plurality of dies on the wafer into a plurality of individual dies.

These embodiments, along with other advantages and features herein disclosed, will become apparent through reference to the following description and the accompanying drawings. Furthermore, it is to be understood that the features of the various embodiments described herein are not mutually exclusive and can exist in various combinations and permutations.

BRIEF DESCRIPTION OF THE DRAWINGS

In the drawings, like reference characters generally refer to the same parts throughout the different views. Also, the drawings are not necessarily to scale, emphasis instead generally being placed upon illustrating the principles of the invention. In the following description, various embodiments of the present invention are described with reference to the following drawings, in which:

FIG. 1 shows a simplified plan view of a semiconductor wafer;

FIGS. 2a-2e, FIGS. 3a-3b, FIGS. 4a-4d and FIGS. 5a-5d show various embodiments of a process for singulating a semiconductor wafer.

DESCRIPTION

Figure 2A:
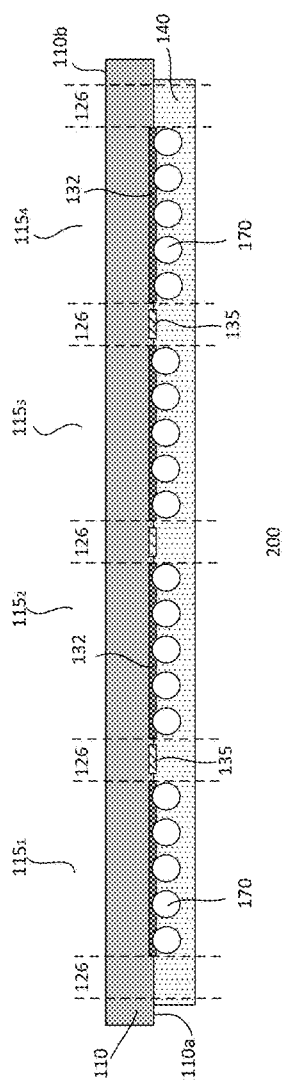

Embodiments generally relate to methods for singulating or dicing a semiconductor wafer. The embodiments as will be described in this disclosure involve plasma etching technique in the singulation process. The embodiments in this disclosure may be applied in singulating any types of wafers, including wafers that are sensitive to mechanical stress such as those wafers having low-k or ultra low-k materials therein. The singulation methods as will be described in this disclosure may also be used for wafer level chip scale package (WLCSP) application, where dicing is performed after packaging is conducted at wafer level. The chip/die or package, for example, may include any type of integrated circuit (IC), such as a memory device including a dynamic random access memory (DRAM), a static random access memory (SRAM) and various types of non-volatile memories including programmable read-only memories (PROM) and flash memories, an optoelectronic device, a logic device, a communication device, a digital signal processor (DSP), a microcontroller, a system-on-chip, as well as other types of devices or a combination thereof. Such dies/chips or packages may be incorporated into electronic products or equipment, such as phones, computers as well as mobile and mobile smart products. Incorporating the dies into other types of products may also be useful.

FIG. 1 shows a simplified plan view of a semiconductor wafer 110. The semiconductor wafer, for example, may be a silicon wafer. Other suitable types of wafers are also useful. For example, the wafer may be a p-type or n-type doped wafer.

Referring to FIG. 1, the wafer includes a first surface 110a on which a plurality of dies/chips 115 are formed. The plurality of dies/chips may be formed on the wafer in parallel. The dies, for example, are arranged in rows along a first (x) direction and columns along a second (y) direction. The wafer, as shown, includes a plurality of main device regions 122 and frame or perimeter regions 126. The main device region includes features and interconnections of a semiconductor die or chip. The main device region includes circuit components (not shown) such as transistors, resistors, capacitors and interconnections to form the die/chip. As for the perimeter region, it surrounds the main device region. The perimeter region, for example, does not contain circuit components and serves as the scribe lanes or dicing channels/streets 126 on the wafer. The adjacent dies/chips are spaced apart or separated from each other by the scribe lanes or dicing channels. The dies are separated from each other by dicing the wafer along these scribe lanes or dicing channels. Various singulation methods as will be described below may be used to separate the dies from the wafer.

FIGS. 2a-2e show an embodiment of a method or process 200 for singulating semiconductor dies or chips from a wafer. The wafer, for example, may be similar or the same as the wafer 110 shown and described in FIG. 1. As such, in the interest of brevity, common elements and features having the same reference numerals may not be described or described in detail.

FIG. 2a shows a wafer 110 having a first surface 110a and a second surface 110b. The wafer serves as a substrate for forming a die or chip. The first surface 110a, for example, is an active surface while the second surface 110b is an inactive or passive surface. The active surface of the wafer refers to the surface where ICs are defined. The passive surface of the wafer refers to the back surface of the wafer away from the surface where ICs are defined. The wafer, for example, includes a semiconductor wafer, such as a silicon wafer. Other suitable types of semiconductor wafers may also be useful. In one embodiment, the wafer is processed to include a plurality of dies or chips 115. For example, a plurality of dies are processed in parallel on the wafer. A die 115 includes circuit components formed on active surface of the wafer or substrate. The circuit components include, for example, transistors, resistors, capacitors and interconnections to form an IC. The plurality of dies are formed on the wafer and are spaced apart from one another by scribe lanes or dicing channels/streets. For simplicity and illustration purpose, the wafer as shown in FIG. 2a includes four dies $115_1$-$115_4$. It is understood that the wafer may include various suitable numbers of dies formed thereon. As shown, each of the dies $115_1$-$115_4$ are spaced apart from one another by dicing channels/streets 126.

Front-end-of line (FEOL) process to form circuit components and back-end-of-line (BEOL) process to form interconnections (e.g., metal lines and via contacts) are performed on the active surface of the wafer. The wafer 110, as shown in FIG. 2a, is processed up to the stage where final passivation film or layer 132 is formed over active surface of the wafer. The final passivation layer, for example, includes polyimide and may be formed over active surface of the wafer by chemical vapor deposition (CVD). Other suitable dielectric materials and techniques may also be employed for forming the final passivation layer. In one embodiment, the passivation layer 132 is formed in such a way that it does not extend over the dicing channels/streets 126. This may be achieved using, for example, mask and etch techniques. For example, a passivation layer may be deposited over the active surface of the wafer and portions of the passivation layer over the dicing channels may be removed by etching using an etch mask. Alternatively, mask such as photoresist may be provided to cover the dicing channels while passivation layer is deposited over the wafer. The passivation layer disposed over the mask may be removed together with the removal of the photoresist, leaving the passivation layer over the main device regions. Other suitable techniques may also be used such that the passivation layer is provided within the periphery of the main device regions without extending to the periphery regions which correspond to the dicing channels.

Depending on requirement, one or more monitoring patterns 135 may be formed in the dicing channels/streets of the wafer. The monitoring patterns, for example, include alignment marks/patterns used for ensuring photolithographic precision alignment for the wafer during photolithography process, process control module (PCM) used for determining whether a formed layer actually has the required thickness and dimension or test element group (TEG) used for measuring electrical characteristics of the formed circuit components. Other suitable monitoring patterns may also be formed in the dicing channels. The monitoring patterns, for example, include metallic materials, such as copper. Other suitable metallic material may also be useful.

In one embodiment, an array of external electrical contacts or die contacts 170 are formed on die contact pads (not shown) exposed by openings (not shown) in the final passivation layer 132 formed over the active surface 110a of the wafer. The die contact pads provide connections to the circuitry of the die. The die contact pads, for example, are formed of a conductive material, such as copper, aluminum, gold, nickel or alloys thereof. Other types of conductive material may also be used for the die contact pads.

In one embodiment, the wafer is a bumped wafer of which external contacts 170 having spherical shaped structures or balls are formed over the active surface of the wafer as shown in FIG. 2a. The external contacts, for example, include solder balls. Providing other suitable types of external contacts, such as but not limited to copper pillars, copper pillars with solder caps, gold stud bumps or a combination thereof, may also be useful. The external contacts provide electrical connection for coupling to an external device (not shown), such as a circuit board. In other embodiments, the wafer may not be provided with external contacts at this stage of processing.

Portions of the wafer substrate 110 may be removed. In one embodiment, a portion of the wafer substrate may be removed using a backgrinding process. This may be achieved by transferring the partially processed wafer to a support platform 140 as shown in FIG. 2a. The support platform, for example, is a backgrinding tape. The partially processed wafer is placed on the support platform such that the active surface 110a of the wafer is facing the support platform. The active surface of the wafer is adhered to the backgrinding tape due to adhesive property of the backgrinding tape. The external contacts 170, as shown, are attached to and embedded in the backgrinding tape. In one embodiment, the backgrinding tape does not extend to the edge of the wafer such that end portions of the active surface of the wafer are exposed along the edge of the wafer.

The exposed second surface 110b of the wafer is processed. For example, the process removes a portion of the wafer substrate from the second surface and reduces the thickness of the wafer from an initial thickness T1 to T2. The thickness of the wafer substrate, in one embodiment, is reduced by performing mechanical grinding, chemical etching or a combination thereof. Other suitable techniques may be used to remove portions of the wafer substrate to reduce the thickness of the wafer. In one embodiment, the thickness of the wafer is reduced to a thickness of T2, which is in the range of about 200-300 μm. Other suitable thickness dimensions may also be useful.

Figure 2B:
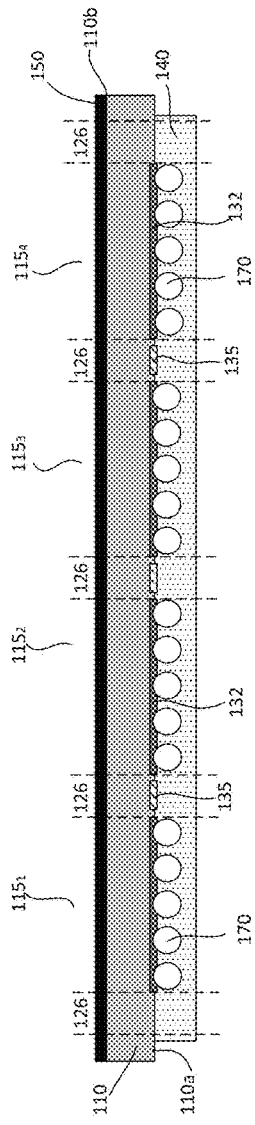

Referring to FIG. 2b, a film is provided and formed over the second surface 110b of the wafer. The film, in one embodiment, is a backside protective layer 150. The backside protective layer, for example, includes thermoplastic polymer based resin film with thermosetting type of adhesive thereon. The backside protective layer may be provided in the form of tape and is applied to the second (or passive) surface 110b of the wafer by lamination process. Other suitable materials and techniques including dispensing, rolling, etc., may also be used for forming the backside protective layer. The backside protective layer 150 includes a thickness of, for example, about 25 μm. Other suitable thickness dimensions may also be useful.

Figure 2C:
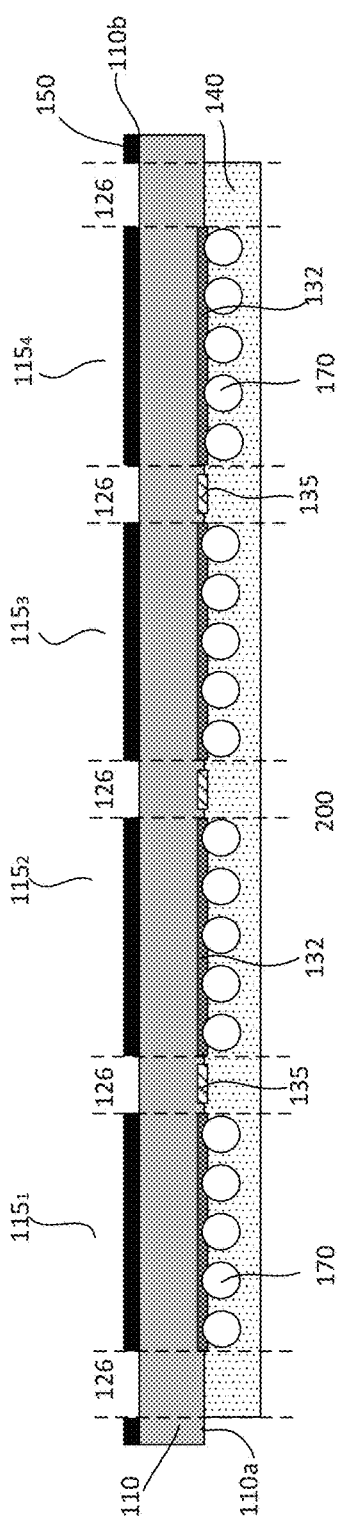

In one embodiment, the process continues by processing the backside protective layer 150. As shown in FIG. 2c, a portion of the backside protective layer is selectively removed to expose underlying portion of the second (or passive) surface 110b of the wafer. In one embodiment, portions of the backside protective layer disposed over areas corresponding to the dicing channels/streets on the active surface of the wafer are removed. These portions of the backside protective layer, in one embodiment, can be removed by chemical etching, laser ablating, mechanical sawing, etc. In one embodiment, infrared camera is used to recognize and record information, such as location, dimension and etc., of the dicing channels on the active surface to guide tools, such as laser beam, diamond cut wheel, to remove portions of the backside protective layer from the passive surface. Other suitable techniques may also be employed to ensure that portions of the backside protective layer overlying areas corresponding to the dicing channels are removed.

Figure 2D:
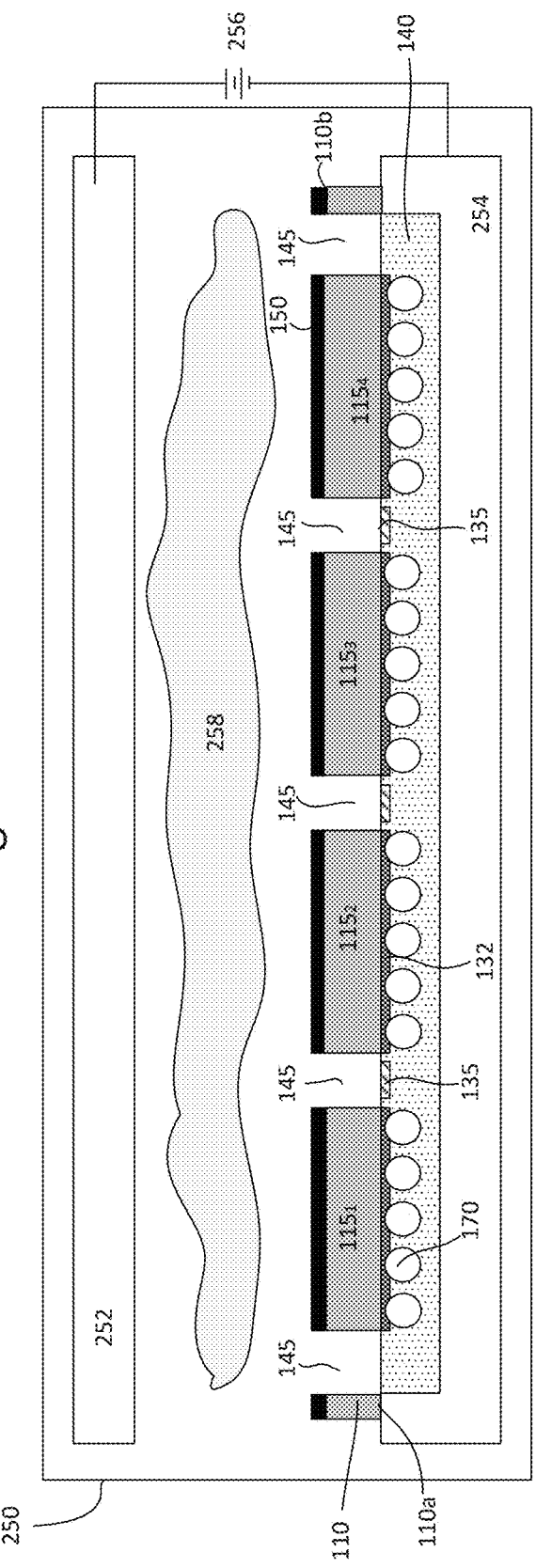

The process continues by removing exposed semiconductor material of the wafer not protected by the backside protective layer. As shown in FIG. 2d, the wafer is placed in a plasma etch chamber 250. The plasma etch chamber may be any suitable type of plasma etch chamber. FIG. 2d shows a simplified view of a plasma etch chamber. The plasma etch chamber includes first (or top) and second (or bottom) plates or electrodes 252 and 254. The top and bottom plates are electrically coupled to a power source 256. The power source, for example, is a DC power source. Other suitable power source to electrically bias the top and bottom electrodes may also be useful. The bottom electrode 254, for example, includes a cavity that accommodates the wafer 110 with the backgrinding tape 140. In one embodiment, the wafer is placed on the bottom electrode such that its active surface 110a is facing and disposed over the bottom electrode 254 while its passive surface 110b is facing away from the bottom electrode. As described, the backgrinding tape does not extend to the edge of the wafer. This allows the backgrinding tape to be disposed within the cavity of the bottom electrode while exposed end portions of the active surface of the wafer along the edge of the wafer are disposed over and in contact with protruded end portions of the bottom electrode so that the wafer is biased during plasma etch process later. Providing a bottom electrode with other suitable configurations for holding and biasing the wafer with backgrinding tape may also be useful.

Reactive gas capable of selectively removes semiconductor material of the wafer is provided in the plasma etch chamber. The reactive gas used, for example, is highly selective to semiconductor material of the wafer, such as silicon. For example, the reactive gas is generally a fluorine-based gas such as $SF_6$, $C_4F_8$, $CHF_3$, $XeF_2$, or any other suitable reactant gas highly selective to silicon material of the wafer substrate. An electromagnetic field (not shown) is applied to the bottom electrode. The electric field ionizes the gas molecules of the reactive gas creating an etchant plasma 258. As shown, the etchant plasma is formed above the wafer 110 with the backside protective layer 150. In one embodiment, the plasma etches or removes the exposed semiconductor material of the wafer, such as silicon, not protected by the backside protective layer. Thus, the processed backside protective layer protects its underlying semiconductor material and also serves as an etch mask during the plasma etch process. As shown in FIG. 2d, the exposed semiconductor material of the wafer not covered by the backside protective layer, in one embodiment, are removed by the plasma etching process through its exposed passive surface 110b. As a result, gaps 145 are formed due to removal of the exposed semiconductor material of the wafer. As the plasma etching process is highly selective to silicon material of the wafer, the plasma etching process stops when it reaches non-silicon material, such as the backgrinding tape or monitoring patterns (if any). Thus, the plasma etching process etches the exposed substrate material of the wafer within the gaps until the silicon material is completely removed to form gaps or trenches that extend down to the top of the backgrinding tape. The gaps, for example, have the same width as the dicing channels and have a depth which is the same as the thickness T2 of the wafer.

In one embodiment, the process continues by providing a support carrier 230 having top and bottom surfaces 230a and 230b. The support carrier, for example, is a temporary carrier for processing the etched wafer. The carrier should be sufficiently rigid to serve as a temporary support to hold the backgrinding tape during further processing later. By way of non-limiting example, the support carrier may be a silicon wafer, metallic plate or the like. Various suitable types of materials may also be used to serve as the support carrier.

In one embodiment, the wafer with the backgrinding tape attached thereto is transferred to the temporary carrier, by having the backgrinding tape attached on the first or top surface 230a of the support carrier as shown in FIG. 2e. The backgrinding tape is attached to the temporary carrier due to its adhesive property. Thus, additional adhesive to attach the backgrinding tape to the support carrier is not required. In other embodiments, an adhesive layer may be provided to attach the wafer with the backgrinding tape to the support carrier. Various suitable types of adhesive that provides temporary bonding of the backgrinding tape to the support carrier may be used.

In one embodiment, a debonding treatment is performed. The debonding treatment, for example, may cause the backgrinding tape to lose or reduce its adhesive strength to allow separation of the singulated dies/chips from the backgrinding tape. The debonding treatment, for example, includes a temperature or heat treatment. Other types of debonding treatments may also be useful. The debonding treatment may depend on the type of backgrinding tape used. The debonding treatment for example, may include any suitable treatment, such as a heating process, UV radiation or a combination thereof. The individual dies or chips which are completely severed by the plasma etch process can be picked up by a pick and place tool. In another embodiment, the backgrinding tape can be attached to a wafer ring (not shown) before being applied to the active surface of the wafer. In such case, the wafer ring and backgrinding tape will function as the support carrier after the plasma etching process. After die pick up, the monitoring patterns 135, such as alignment marks or patterns, PCM or TEG will remain on the surface of the backgrinding tape 140.

FIGS. 3a-3b show an embodiment of a process 300 for singulating or dicing semiconductor dies or chips from a wafer. The process 300 may include similar processes such as those described in process 200 shown in FIGS. 2a-2e. In the interest of brevity, common processes and common features or elements having the same reference numerals may not be described or described in detail. The description below primarily focuses on the differences between process 300 and process 200.

As shown in FIG. 3a, the wafer 110 is processed at the same stage as that described in FIG. 2a. In one embodiment, the wafer 110 is processed to include a plurality of dies or chips 115. The plurality of dies are formed on the wafer and are spaced apart from one another by scribe lanes or dicing channels/streets 126. Depending on requirement, monitoring patterns 135, such as alignment patterns or marks, PCM and/or TEG, may be formed in the dicing channels/streets of the wafer. The wafer 110 is processed up to the stage where final passivation layer 232 is formed over active surface 110a of the wafer. In one embodiment, the passivation layer 232 as shown in FIG. 3a differs from the passivation layer 132 as shown in FIG. 2a in that the passivation layer 232 is formed in such a way that it also extends over the dicing channels/streets 126. The passivation layer 232, for example, may cover the monitoring patterns disposed in the dicing channels.

In one embodiment, the wafer is a bumped wafer of which external contacts 170 having spherical shaped structures or balls are formed over the active surface of the wafer as shown in FIG. 3a. The wafer is placed on the support platform 140, such as a backgrinding tape. As shown, the active surface 110a of the wafer is facing the support platform. The external contacts 170 are attached to and embedded in the backgrinding tape 140. Similar to that described in FIG. 2a, the backgrinding tape does not extend to the edge of the wafer such that end portions of the active surface of the wafer are exposed along the edge of the wafer.

The process 300 continues with additional processing such as those described in FIGS. 2b-2d. For example, a backgrinding process may be performed to reduce the initial thickness T1 of the wafer to a reduced thickness T2, providing a backside protective layer 150 over the second (or passive) surface of the wafer and processing the backside protective layer such that portions of the backside protective layer disposed over areas corresponding to the dicing channels/streets on the active surface of the wafer are removed. The additional processing also includes performing a plasma etch process to remove exposed semiconductor material of the wafer, such as silicon, not protected by the backside protective layer through the exposed passive surface. These additional processing involve materials and techniques which are similar or the same as those shown from FIG. 2b to FIG. 2d and their corresponding descriptions and therefore will not be repeated herein.

The plasma etching process is highly selective to silicon material of the wafer. As such, in one embodiment, the processed backside protective layer serves as the etch mask for the plasma etching process. The plasma etching process removes the exposed silicon material of the wafer and stops when it reaches non-silicon material, such as the passivation layer 232 or monitoring patterns (if any). Thus, the plasma etch process etches the exposed substrate material of the wafer within the gaps until the silicon material is removed to form gaps or trenches that extend down until it reaches the surface of the passivation layer and/or the monitoring patterns (if any). The gaps, for example, have the same width as the dicing channels and have the same depth as the thickness T2 of the wafer.

In one embodiment, the wafer with the backgrinding tape attached thereto is transferred to the temporary carrier 230, by having the backgrinding tape attached onto the first or top surface 230a of the support carrier as shown in FIG. 3b. A debonding treatment may be performed such that the backgrinding tape loses its adhesiveness. The individual dies or chips which are completely severed by the plasma etch process can be picked up by a pick and place tool. In one embodiment, the passivation layer 232 can be severed during the die pick up process. For example, the pulling force during the die pick up process causes the passivation layer 232 to break along the edges or sidewalls of the die, severing the passivation layer of each die/chip from each other. After die pick up, the monitoring patterns 135, such as alignment marks or patterns, PCM or TEG will remain on the surface of the backgrinding tape 140. In another embodiment, a jet of air blow or laser beam can be applied to the passivation layer through the gaps 145 formed during the plasma etching process. For example, the jet of air blow or laser beam removes the exposed portions of the passivation layer within the dicing channel/streets so that passivation layer of each chip is separated from each other. In other embodiments, an additional tape (not shown) may be provided over the backside protective layer 150 and the backgrinding tape 140 can be removed using suitable UV or heat treatment. The passivation layer can be severed when the backgrinding tape is removed or peeled off. This separates the passivation layer of each chip from each other. In the event that the additional tape is provided over the backside protective layer, the temporary carrier may still be attached over the backgrinding tape. The temporary carrier attached to the backgrinding tape, for example, may be removed together during the peeling off of the backgrinding tape. The additional tape can be a dicing tape, a metallic plate, a semiconductor/ceramic wafer, etc.

FIGS. 4a-4c show another embodiment of a process 400 for singulating semiconductor dies or chips from a wafer. The process 400 may include similar processes such as those described in process 200 shown in FIGS. 2a-2e and process 300 shown in FIGS. 3a-3b. In the interest of brevity, common processes and common features or elements having the same reference numerals may not be described or described in detail. The description below primarily focuses on the differences between process 400 and process 200 or process 300.

As shown in FIG. 4a, the wafer 110 is processed at the same stage as that described in FIG. 3a. In one embodiment, the wafer 110 is processed to include a plurality of dies or chips 115. The plurality of dies are formed on the wafer and are spaced apart from one another by scribe lanes or dicing channels/streets 126. Depending on requirement, monitoring patterns 135, such as alignment patterns or marks, PCM and/or TEG, may be formed in the dicing channels/streets of the wafer. The wafer 110 is processed up to the stage where final passivation film or layer is formed over active surface 110a of the wafer. In one embodiment, the passivation layer 232 is formed in such a way that it also extends over the dicing channels/streets 126 as shown in FIG. 3a. In other embodiments, the passivation layer may be formed such that it does not extend over the dicing channels/streets 126 similar to the passivation layer 132 as shown in FIG. 2a.

In one embodiment, the wafer is a bumped wafer of which external contacts 170 are formed over the active surface of the wafer as shown in FIG. 4a. The wafer, for example, may be placed on a support platform, such as a backgrinding tape (not shown) and a backgrinding process is performed to reduce the initial thickness of the wafer, similar to that described in FIG. 2a. The backgrinding process involves techniques which are similar to that shown in FIG. 2a and its corresponding descriptions and therefore will not be repeated herein.

The bumped wafer 110 is provided on a support carrier 430. The support carrier 430, for example, is secured by a ring or frame 432 and serves as a temporary carrier for processing the bumped wafer. The carrier should be sufficiently rigid to serve as a temporary support and to hold the wafer during removal of the backgrinding tape. By way of non-limiting example, the support carrier may be a semiconductor/ceramic wafer, metallic plate or the like. Various suitable types of materials may be used to serve as the support carrier. The support carrier includes top and bottom major surfaces 430a and 430b. The wafer 110 is placed on the top surface 430a of the support carrier. As shown, the wafer is disposed such that the second (or inactive) surface 110b of the wafer contacts the top surface 430a of the support carrier while the first (or active) surface 110a of the wafer is away from the support carrier as shown in FIG. 4b. The support platform, such as the backgrinding tape (not shown), is removed using suitable debonding treatment.

In one embodiment, the process continues by removing portions of the passivation layer and monitoring patterns (if any) over the dicing channels as shown in FIG. 4b. In one embodiment, these portions of the passivation layer and monitoring patterns may be removed by non-etching techniques including laser ablating, mechanical sawing at low rotational speed, etc. Other suitable techniques may also be employed. These non-etching techniques used for removing portions of the passivation layer and monitoring patterns (if any) can control or minimize formation of rough/uneven lateral surfaces or sidewalls of the singulated die later. The removal of these portions of the passivation layer and monitoring patterns exposes the underlying semiconductor material, such as silicon, of the wafer. In some embodiments, the removal of these portions of the passivation layer may also remove a portion of the underlying semiconductor material of the wafer.

Referring to FIG. 4c, the process continues by placing the wafer into the plasma etch chamber 250. In one embodiment, the wafer is placed on the bottom electrode such that its passive surface 110b is facing and disposed over the bottom electrode 254 while its active surface 110a is facing away from the bottom electrode. For example, the wafer 110 together with the support carrier 430 is placed over the bottom electrode. In such case, the bottom electrode 254 as shown in FIG. 4c may have a planar top surface, different than the configuration of the bottom electrode 254 shown in FIG. 2d. In one embodiment, a plasma etching process is performed to remove exposed portions of the semiconductor material not protected by the passivation layer through the exposed active surface 110a of the wafer. In this case, the passivation film or layer disposed over the main device regions serves as an etch mask for removing exposed portions of the semiconductor material in the dicing channels. The plasma etching process is similar to that shown in FIG. 2d and its corresponding descriptions and therefore will not be repeated herein.

The plasma etching process is highly selective to silicon material of the wafer. As such, in one embodiment, the plasma etching process stops when it reaches non-silicon material, such as the support 430. Thus, the plasma etches the exposed substrate material of the wafer until the silicon material is removed to form gaps or trenches 145 that extend down until it reaches the surface of the support carrier. The gaps, for example, have the same width as the dicing channels. Referring to FIG. 4d, the individual dies or chips 115 which are completely severed by the plasma etch process disposed over the support carrier 430 are ready to be picked up by a pick and place tool (not shown) for further processing or packaging.

FIGS. 5a-5d show an embodiment of a process 500 for singulating semiconductor dies or chips from a wafer. The process 500 may include similar processes such as those described in process 200 shown in FIGS. 2a-2e. In the interest of brevity, common processes and common features or elements having the same reference numerals may not be described or described in detail. The description below primarily focuses on the differences between process 500 and process 200.

Figure 5A:
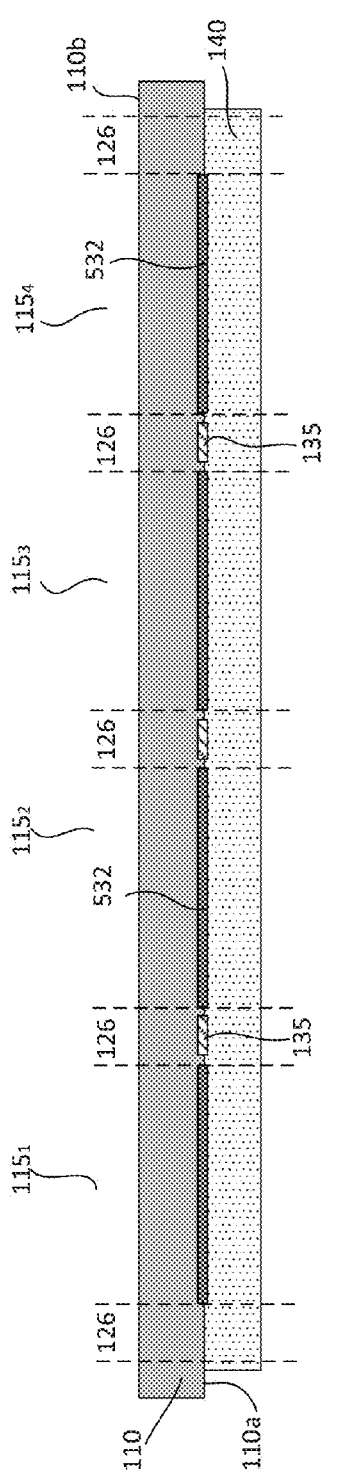

As shown in FIG. 5a, the wafer 110 is processed similarly as that shown in FIG. 2a. In one embodiment, the wafer 110 is processed to include a plurality of dies or chips 115. The plurality of dies are formed on the wafer and are spaced apart from one another by scribe lanes or dicing channels/streets 126. Depending on requirement, monitoring patterns 135, such as alignment patterns or marks, PCM and/or TEG, may be formed in the dicing channels/streets of the wafer. The wafer 110 is processed up to the stage where final passivation layer 532 is formed over active surface 110a of the wafer. In one embodiment, the passivation layer 532 is similar to passivation layer 132 as shown in FIG. 2a in that the passivation layer 532 is formed such that it does not extend over the dicing channels/streets 126.

In one embodiment, die contact pads (not shown) are exposed by openings (not shown) formed through the final passivation layer 532 which is disposed over the active surface 110a of the wafer substrate. The die contact pads are suitable for accommodating or receiving wire bonds. The die contact pads, for example, are formed of a conductive material, such as copper, aluminum, gold, nickel or alloys thereof. Other types of conductive material may also be used for the die contact pads.

The wafer is placed on the support platform 140, such as a backgrinding tape. In one embodiment, the wafer is positioned over the support platform such that the active surface 110a of the wafer is facing the support platform. As shown in FIG. 5a, the active surface 110a of the wafer and the passivation layer 532 are attached and adhered to the backgrinding tape due to adhesiveness of the backgrinding tape. Similar to that described in FIG. 2a, the backgrinding tape does not extend to the edge of the wafer such that end portions of the active surface of the wafer are exposed along the edge of the wafer.

Figure 5B:
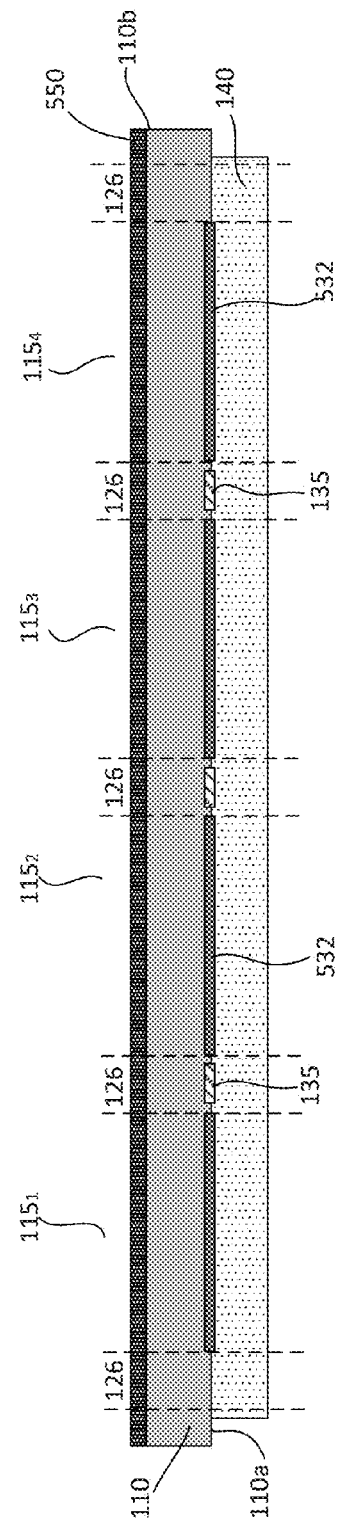

The process 500 continues by processing the exposed second surface 110b of the wafer. For example, the process continues to remove a portion of the wafer substrate and reduces the thickness of the wafer from an initial thickness T1 to T2 using techniques as shown and described in FIG. 2a. In one embodiment, a die attach film 550 is provided and formed over the second surface 110b of the wafer as shown in FIG. 5b. The die attach film 550, for example, includes an adhesive material to be used for attaching singulated dies to leadframe or package substrate in subsequent processing. The die attach film 550 may be provided in the form of tape and is applied to the second (or passive) surface 110b of the wafer by lamination process. Other suitable materials and techniques including dispensing, rolling, etc., may also be used for forming the die attach film. The die attach film 550 includes a thickness of, for example, about 25 μm. Other suitable thickness dimensions may also be useful.

In one embodiment, the process continues by processing the die attach film 550. As shown in FIG. 5c, a portion of the die attach film is selectively removed to expose underlying portion of the second (or passive) surface 110b of the wafer. In one embodiment, portions of the die attach film disposed over areas corresponding to the dicing channels/streets on the active surface of the wafer are removed. These portions of the die attach film, in one embodiment, can be removed by chemical etching, laser ablating, mechanical sawing, etc. In one embodiment, infrared camera is used to recognize and record information, such as location, dimension and etc., of the dicing channels on the active surface to guide tools, such as laser beam, diamond cut wheel, to remove the die attach film from the passive surface. Other suitable techniques may also be employed to ensure that portions of the die attach film overlying areas corresponding to the dicing channels are removed.

In other embodiments, the die attach film 550 may be selectively formed over areas of the passive surface 110b of the wafer which correspond to the main device regions on the active surface of the wafer without extending into areas of the passive surface of the wafer which correspond to the dicing channels. This, for example, may be achieved by printing or spraying process to selectively form the die attach film over the main device regions with the assistance of a stencil. Other suitable techniques may also be employed to selectively form the die attach film.

The process continues by removing exposed semiconductor material of the wafer not protected by the die attach film. In one embodiment, a plasma etch process is performed to remove exposed semiconductor material of the wafer, such as silicon, not protected by the die attach film through the exposed passive surface as shown in FIG. 5d. In such case, the die attach film protects its underlying semiconductor material of the wafer and also serves as an etch mask during the plasma etch process. The plasma etch process is performed in the plasma etch chamber 250 using reactive gas and techniques which are similar to those shown in FIG. 2d and its corresponding descriptions and therefore will not be repeated herein.

The plasma etching process is highly selective to silicon material of the wafer. As such, in one embodiment, the plasma etching process stops when it reaches non-silicon material, such as the passivation layer 532 or monitoring patterns (if any). Thus, the plasma etches the exposed substrate material of the wafer within the gaps until the silicon material is removed to form gaps or trenches 145 that extend down until it reaches the surface of the backgrinding tape and/or the monitoring patterns (if any). The gaps, for example, have the same width as the dicing channels.

In one embodiment, the process 500 continues by performing additional processing similar to that described in FIG. 2e and its corresponding description. For example, the process continues to remove the backgrinding tape using techniques described in FIG. 2e. The dies/chips singulated by the plasma etch process are ready to be picked up by a pick and place tool. The die/chip having die attach film over its passive surface is ready to be attached to leadframe or package substrate for further processing or packaging later.

The process 500 as described with respect to FIGS. 5a-5d show that the passivation layer 532 does not extend to the dicing channels. In other embodiments, the process 500 may be modified such that the passivation layer covers the main device regions and the dicing channels similar to the passivation layer 232 shown and described in FIG. 3a. In such case, further processing of the wafer remain similar or the same as that described in FIGS. 5a-5d except that the passivation layer 232 can be severed during the die pick up process which is described in FIG. 3b.

The process 200, 300, 400 and 500 as described above result in advantages. For example, as described in FIGS. 2a-2e and FIGS. 3a-3b, during the plasma etch process to singulate the dies/chips, the electrical contacts 170 are embedded in the backgrinding tape while the passivation layer is attached to the backgrinding tape. Thus, fluorine contamination on the electrical contacts and passivation layer of the chips are prevented. As described, the plasma etch process is highly selective to substrate material of the wafer and is performed through the passive surface of the wafer. Thus, the plasma etch process effectively and completely sever the dies from the wafer even if the monitoring patterns are made of metallic material which does not chemically react with plasma glow are present in the wafer and under-etch of the passive surface is avoided. Moreover, the embodiments as described above result in smooth and even lateral surfaces or sidewalls of the singulated dies as outline of passivation layers on one chip and residue of alignment mark, PCM or TEG on the dicing channel would not cause an issue during the singulation process using plasma etch technique.

In addition, the process 200, 300, 400 or 500 provides higher throughput as all the chips/dies are singulated or separated from the wafer simultaneously. The process 200, 300, 400 or 500 as described allows smaller or narrower dicing channels to be formed since singulation is achieved using plasma etching technique and not using mechanical sawing. This enables more circuit components to be formed and maximizes silicon utilization on wafers. The embodiments also provide higher yields as defects caused by mechanical stress are reduced or avoided. Moreover, the singulation methods as described may use existing manufacturing facilities without capital investment on new or additional apparatus or lithographic equipment.

The invention may be embodied in other specific forms without departing from the spirit or essential characteristics thereof. The foregoing embodiments, therefore, are to be considered in all respects illustrative rather than limiting the invention described herein.

What is claimed is:

1. A method for dicing a wafer comprising:
providing a wafer having first and second major surfaces, wherein the wafer is prepared with a plurality of dies on main device regions and are spaced apart from each other by dicing channels on the first major surface of the wafer, wherein
the first major surface is an active surface and the second major surface is a passive surface,
the wafer is processed to include a passivation layer formed over the active surface of the wafer, and
the passivation layer extends over the main device regions and the dicing channels;
providing a protective film over the second major surface of the wafer, wherein the protective film is patterned to cover areas of the wafer corresponding to the main device regions and expose areas of the wafer corresponding to the dicing channels;
using the patterned protective film as an etch mask, performing a plasma etching process to remove exposed semiconductor material of the wafer and form trenches within the wafer, wherein the trenches extend through the wafer to expose portions of the passivation layer extending over the dicing channels; and
performing a non-etching process on the passivation layer to singulate the plurality of dies.

2. The method of claim 1 wherein the first major surface of the wafer is where integrated circuits are defined and the second major surface of the wafer is a back surface of the wafer.

3. The method of claim 1 wherein providing the protective film comprises forming a thermoplastic polymer based resin film on the second major surface of the wafer.

4. The method of claim 1 wherein patterning the protective film comprises selectively removing portions of the protective film disposed over areas corresponding to the dicing channels of the wafer, wherein the trenches formed by the plasma etching includes about a same width as the dicing channels.

5. The method of claim 1 comprising providing a support platform and attaching the first major surface of the wafer to the support platform.

6. The method of claim 5 wherein the wafer comprises one or more monitoring patterns formed in the dicing channels of the wafer and the one or more monitoring patterns contact the support platform when the first major surface of the wafer is attached to the support platform.

7. The method of claim 6 wherein singulating the plurality of dies comprises removing each die from the support platform, wherein the monitoring patterns remain on the support platform after the individual dies are removed.

8. The method of claim 1 wherein the wafer comprises one or more monitoring patterns formed in the dicing channels of the wafer.

9. The method of claim 8 wherein the passivation layer covers the main device regions and the one or more monitoring patterns on the active surface of the wafer.

10. The method of claim 1 wherein the plasma etching process is highly selective to silicon material and does not etch through the passivation layer.

11. The method of claim 1 wherein the non-etching process is performed through the trenches formed during the plasma etching process to severe and separate the passivation layer of individual dies.

12. The method of claim 11 wherein the non-etching process comprises a die pick up process, wherein the passivation layer of each die is separated by a pulling force during the die pick up process.

13. The method of claim 11 wherein performing the non-etching process comprises applying a jet of air blow or laser beam to the portions of passivation layer exposed by the trenches.

14. A method for dicing a wafer comprising:
providing a wafer having first and second major surfaces, wherein the wafer is prepared with a plurality of dies on main device regions and are spaced apart from each other by dicing channels on the first major surface of the wafer, wherein
the first major surface is an active surface and the second major surface is a passive surface,
the wafer is processed to include a passivation layer formed over the active surface of the wafer, and
the passivation layer extends over the main device regions and the dicing channels;
providing a backside protective layer on the second major surface of the wafer, wherein the backside protective layer is patterned to remove portions of the backside protective layer disposed over areas corresponding to the dicing channels, wherein the patterned backside protective layer partially exposes the second major surface of the wafer;
performing a plasma etching process to remove semiconductor material of the wafer exposed by the patterned backside protective layer, the plasma etching process forms gaps extending through the wafer to expose portions of the passivation layer, wherein the passivation layer is not removed; and
performing a non-etching process on the passivation layer to singulate the plurality of dies.

15. The method of claim 14 wherein the plasma etching process is highly selective to silicon material, wherein the passivation layer includes non-silicon material.

16. The method of claim 14 comprising providing a support platform and attaching the first major surface of the wafer to the support platform, wherein the support platform does not extend to cover end portions of the first major surface of the wafer.

17. The method of claim 16 comprising providing a temporary support carrier and attaching the support platform to a top surface of the temporary support carrier.

18. The method of claim 17 wherein performing the non-etching process includes performing a die pick up process to remove individual dies from the support platform, wherein the die pick process severe portions of the passivation layer by a pulling force.

19. The method of claim 14 wherein performing the non-etching process comprises applying a jet of air blow or laser beam to the passivation layer through the gaps formed during the plasma etching process to severe portions of the passivation layer.

20. The method of claim 14 wherein the wafer comprises one or more monitoring patterns formed in the dicing channels of the wafer, wherein the plasma etching process does not remove the one or more monitoring patterns in the dicing channels.

* * * * *